US009671449B2

(12) United States Patent
Coutelou et al.

(10) Patent No.: US 9,671,449 B2
(45) Date of Patent: Jun. 6, 2017

(54) SYSTEM FOR DETECTING AN ELECTRICAL FAULT AND ASSOCIATED METHOD

(71) Applicant: Schneider Electric Industries SAS, Rueil Malmaison (FR)

(72) Inventors: Olivier Coutelou, Grenoble (FR); Michel Clemence, Chambery (FR); Jean-Luc Bertocchi, Sassenage (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 129 days.

(21) Appl. No.: 14/797,360

(22) Filed: Jul. 13, 2015

(65) Prior Publication Data

US 2016/0091550 A1    Mar. 31, 2016

(30) Foreign Application Priority Data

Sep. 26, 2014    (FR) ...................................... 14 59150

(51) Int. Cl.
*G01R 31/08*    (2006.01)
*G01R 31/02*    (2006.01)
(Continued)

(52) U.S. Cl.
CPC ......... *G01R 31/021* (2013.01); *G01R 21/133* (2013.01); *G01R 22/063* (2013.01);
(Continued)

(58) Field of Classification Search
CPC .... G01R 31/021; G01R 31/02; G01R 31/024; G01R 31/08
(Continued)

(56) References Cited

U.S. PATENT DOCUMENTS 8,861,155 B2 * 10/2014 Rostron ................. H02H 3/083
361/76
2009/0088989 A1    4/2009 Guzman-Casillas
(Continued)

FOREIGN PATENT DOCUMENTS

FR         2 991 057 A1    11/2013
WO    WO 2010/076406 A1    7/2010

OTHER PUBLICATIONS

French Preliminary Search Report issued Jun. 3, 2015 in French Application 14 59150, filed on Sep. 26, 2014 ( with English translation of Categories of Cited Documents).

*Primary Examiner* — Amy He
(74) *Attorney, Agent, or Firm* — Oblon, McClelland, Maier & Neustadt, L.L.P.

(57) ABSTRACT

A system for detecting an electrical fault in an electrical installation including several electrical conductors, the system including at least two measurement modules, each measurement module including first radioelectric communication device, a sensor for measuring each electrical magnitude associated with a corresponding electrical conductor and a first clock defined by a first initial instant and a first clock frequency, each measured value being suitable for being associated with a first instant of measurement, determined with respect to the first initial instant and as a function of the first frequency, an acquisition unit, including second radioelectric means adapted for communicating with the first radioelectric communication device.

15 Claims, 3 Drawing Sheets

(51) Int. Cl.
*G01R 31/14* (2006.01)
*G01R 21/133* (2006.01)
*G01R 22/06* (2006.01)

(52) U.S. Cl.
CPC ........... *G01R 31/02* (2013.01); *G01R 31/024* (2013.01); *G01R 31/08* (2013.01); *G01R 31/088* (2013.01)

(58) Field of Classification Search
USPC ........................................ 324/522, 539, 509
See application file for complete search history.

(56) References Cited

U.S. PATENT DOCUMENTS

| | | | | |
|---|---|---|---|---|
| 2015/0070026 A1* | 3/2015 | Vincent | .................. | H01H 71/04 324/522 |
| 2015/0142354 A1* | 5/2015 | Coutelou | ............... | G01D 4/002 702/64 |

* cited by examiner

SYSTEM FOR DETECTING AN ELECTRICAL FAULT AND ASSOCIATED METHOD

The present invention relates to a system for detecting an electrical fault in an electrical installation comprising several electrical conductors, the system comprising:
- at least two measurement modules, each measurement module comprising first radioelectric communication means, a sensor for measuring each electrical magnitude associated with a corresponding electrical conductor and a first clock defined by a first initial instant and a first clock frequency, each measured value being suitable for being associated with a first instant of measurement, determined with respect to the first initial instant and as a function of the first frequency,
- an acquisition unit for acquiring the measured values, comprising second radioelectric means adapted for communicating with the first radioelectric communication means.

The present invention also relates to a method for detecting an electrical fault in an electrical installation.

In the field of the detection of electrical faults at the level of an electrical installation comprising several electrical conductors and in particular at the level of an overhead electricity transport network, it is known to use a system for detecting an electrical fault on the basis of measurements of current carried out at the level of the various electrical conductors. Such a system then comprises a module for measuring the current for each electrical conductor and a unit for acquiring the measured values. Each measurement module comprises first radioelectric communication means, a sensor for measuring the current passing through the corresponding electrical conductor and a clock defined by an initial instant and a clock frequency. Each measured value of the current is then associated with an instant of measurement, determined with respect to the initial instant and as a function of the clock frequency. Furthermore, the acquisition unit comprises second radioelectric communication means adapted for communicating with the first radioelectric communication means.

The detection system is, for example, intended to recover the values of current measured by each measurement module and to sum them to confirm or otherwise the occurrence of the electrical fault, so as to isolate the electrical fault. So that the sum of the currents gives a utilizable result which is representative of reality, it is necessary that the summed values of current be measured at the same instant.

For this purpose, in the known detection systems, the acquisition unit transmits a synchronization message simultaneously to each measurement module. Each measurement module restarts the measurement of the current passing through the electrical conductor corresponding to the moment of the reception of the synchronization message and performs a sampling of the values of currents measured as a function of the clock frequency and of the instant of reception of the synchronization message.

However, in such systems, the detection of an electrical fault is complex to perform and inaccurate, and the amount of information processed and exchanged between the measurement modules and the acquisition unit is large. This gives rise in particular to high consumption and to risks of non-reception of certain transmitted information. Such detection systems do not make it possible in particular to guarantee the detection of an electrical fault in a three-phase overhead electrical network with compensated neutral. Indeed, it should be noted that in such a network the fault current is low in comparison to a load current, flowing on the electrical conductors directed towards a load to be supplied, thereby preventing the detection of the electrical fault via the known detection systems.

The aim of the invention is therefore to propose a system for detecting an electrical fault in an electrical installation comprising several electrical conductors making it possible to improve and to facilitate the detection of the electrical fault, as well as to reduce the amount of information processed and exchanged between the measurement modules and the acquisition unit.

For this purpose, the subject of the invention is a detection system of the aforementioned type, characterized in that the system comprises, for at least one of the measurement modules, a member for detecting the electrical fault associated with the corresponding electrical conductor, the detection member being suitable for determining the value of an instant of detection of the fault with respect to the first initial instant and as a function of the first frequency, in that the acquisition unit comprises:
- first means for determining the value of each instant of detection with respect to the first initial instant and as a function of the first frequency of the other measurement modules,
- means of acquisition for each measurement module of solely the measured values for which the first instant of measurement lies in a corresponding first predefined time interval, each corresponding first interval comprising the value of the instant of detection determined for the said measurement module with which it is associated.

By virtue of the invention, the values of each electrical magnitude measured by each measurement module at the moment of the instant of detection are precisely identified, since the value of the instant of detection is precisely determined, with respect to the first initial instant and as a function of the first clock frequency of the first clock of each measurement module. This makes it possible to take into account the differences in values between the first initial instant of each first clock and between the first frequency of each first clock and to acquire, for each measurement module, the values measured around one and the same absolute instant corresponding to the detection of the assumed electrical fault. The values acquired by the acquisition unit for each measurement module have therefore been measured substantially at the same instant and at the moment of the occurrence of the assumed electrical fault, thereby making it possible to facilitate and to improve the detection of the electrical fault on the basis of these values, and advantageously to confirm the occurrence of the electrical fault on the basis of these values. Moreover, the fact that only the values acquired are included in predefined intervals makes it possible to reduce the amount of information processed and exchanged between the measurement modules and the acquisition unit.

According to advantageous aspects of the invention, the detection system furthermore comprises one or more of the following characteristics, taken in isolation or according to all technically admissible combinations:
- the acquisition unit comprises a second clock defined by a second initial instant and a second clock frequency, and in which the first determination means are suitable for determining the value of the instant of detection, with respect to the second initial instant and as a function of the second frequency;
- the acquisition unit comprises a second clock defined by a second initial instant and a second clock frequency, and in which the acquisition unit comprises second means of determination, for each acquired value, of a second instant of measurement of the said value, determined with respect to the second initial instant and as a function of the second frequency;

the acquisition unit comprises first calculation means suitable for calculating a series of third instants regularly spaced and determined with respect to the second initial instant and as a function of the second frequency, and second calculation means suitable for estimating the value of each electrical magnitude measured, at the third instants and as a function of the values acquired and of the second instants of measurement;

the electrical magnitude or magnitudes are chosen from among a voltage and a current;

the acquisition unit comprises confirmation means adapted for confirming the occurrence of the electrical fault as a function of the values acquired and of the associated second instants of measurement;

each measurement module comprises means for generating a cyclic message, comprising a first variable dependent on an instant of emission of the cyclic message with respect to the first initial instant and according to the first frequency, and means for transmitting the cyclic message destined for the acquisition unit, in which the acquisition unit is suitable for determining an instant of reception of the cyclic message, with respect to the second initial instant and as a function of the second frequency, and in which, for each measurement module, the acquisition unit comprises third means for calculating a ratio between, on the one hand, a first duration between two successive instants of emission and, on the other hand, a second duration between two corresponding instants of reception;

each measurement module furnished with a detection member comprises fourth means of calculation of a duration of transmission, the fourth calculation means being suitable for associating with each instant of detection a following instant of emission, after the instant of detection, and for calculating the duration of transmission between the instant of detection and the following instant of emission, the cyclic message comprising the duration of transmission;

the first determination means are suitable for calculating, with respect to the second initial instant and as a function of the second frequency, the value of the instant of detection as a function of the duration of transmission, of the value of the instant of reception and of the ratio;

the first determination means are suitable for calculating, for each measurement module, a third duration between the instant of reception of a last cyclic message transmitted by the measurement module and the instant of detection calculated with respect to the second initial instant and as a function of the second frequency, and for determining, with respect to the first initial instant and to the first frequency of each measurement module, the value of the instant of detection as a function of the instant of emission of the last cyclic message, of the corresponding ratio and of the corresponding third duration;

the acquisition unit comprises, for each measurement module, means for defining the corresponding first interval predefined as a function of the corresponding ratio, of a corresponding third duration and of the time of emission of a last cyclic message with respect to the first initial instant and as a function of the first frequency;

each measurement module comprises a sampling member suitable for sampling the measured values of each electrical magnitude according to a sampling frequency, a sample number and the corresponding first instant of measurement being associated with each sample, the acquisition means are suitable for transmitting to each measurement module, via a selection message, the corresponding first interval, and each measurement module is suitable for transmitting to the acquisition unit, via an acquisition message, the samples whose first instant lies in the corresponding first interval received and at least one second variable relating to the first instant of measurement of one of the samples.

The subject of the invention is also a method for detecting an electrical fault in an electrical installation comprising several electrical conductors, the method being implemented with the aid of a system for detecting the electrical fault comprising:

at least two measurement modules, each measurement module comprising first radioelectric communication means, a sensor for measuring each electrical magnitude associated with a corresponding electrical conductor and a first clock defined by a first initial instant and a first clock frequency, each measured value being suitable for being associated with a first instant of measurement determined with respect to the first initial instant and as a function of the first frequency, an acquisition unit for acquiring the measured values, comprising second radioelectric communication means adapted for communicating with the first radioelectric means, characterized in that the method comprises, for at least one of the measurement modules, the following steps the detection of the electrical fault on the corresponding electrical conductor, the determination of the value of an instant of detection of the fault with respect to the first initial instant and as a function of the first frequency, and in that the method comprises the following steps:

the determination by the acquisition unit of the value of each instant of detection with respect to the first initial instant and as a function of the first frequency of the other measurement modules, the acquisition, by the acquisition unit and for each measurement module, of solely the measured values for which the first instant of measurement lies in a corresponding first predefined time interval, each corresponding first interval comprising the value of the instant of detection determined for the said measurement module.

Advantageously, the detection method furthermore comprises one or more of the following characteristics, taken in isolation or according to all technically admissible combinations:

the acquisition unit comprises a second clock defined by a second initial instant and a second clock frequency, and in which, during the acquisition step, the method comprises the following step:

the calculation, for each acquired value, of a second instant of measurement of the value, determined with respect to the second initial instant and as a function of the second frequency;

prior to the determination step, the method comprises an identification step, in the course of which the acquisition unit verifies whether or not one of the measurement modules has detected the electrical fault, and in which the determination step and the acquisition step are performed only if the occurrence of the electrical fault is identified during the identification step.

The invention will be better understood and other advantages thereof will be apparent in the light of the description which follows, given solely by way of nonlimiting example, while referring to the appended drawings in which.

Figure 1:
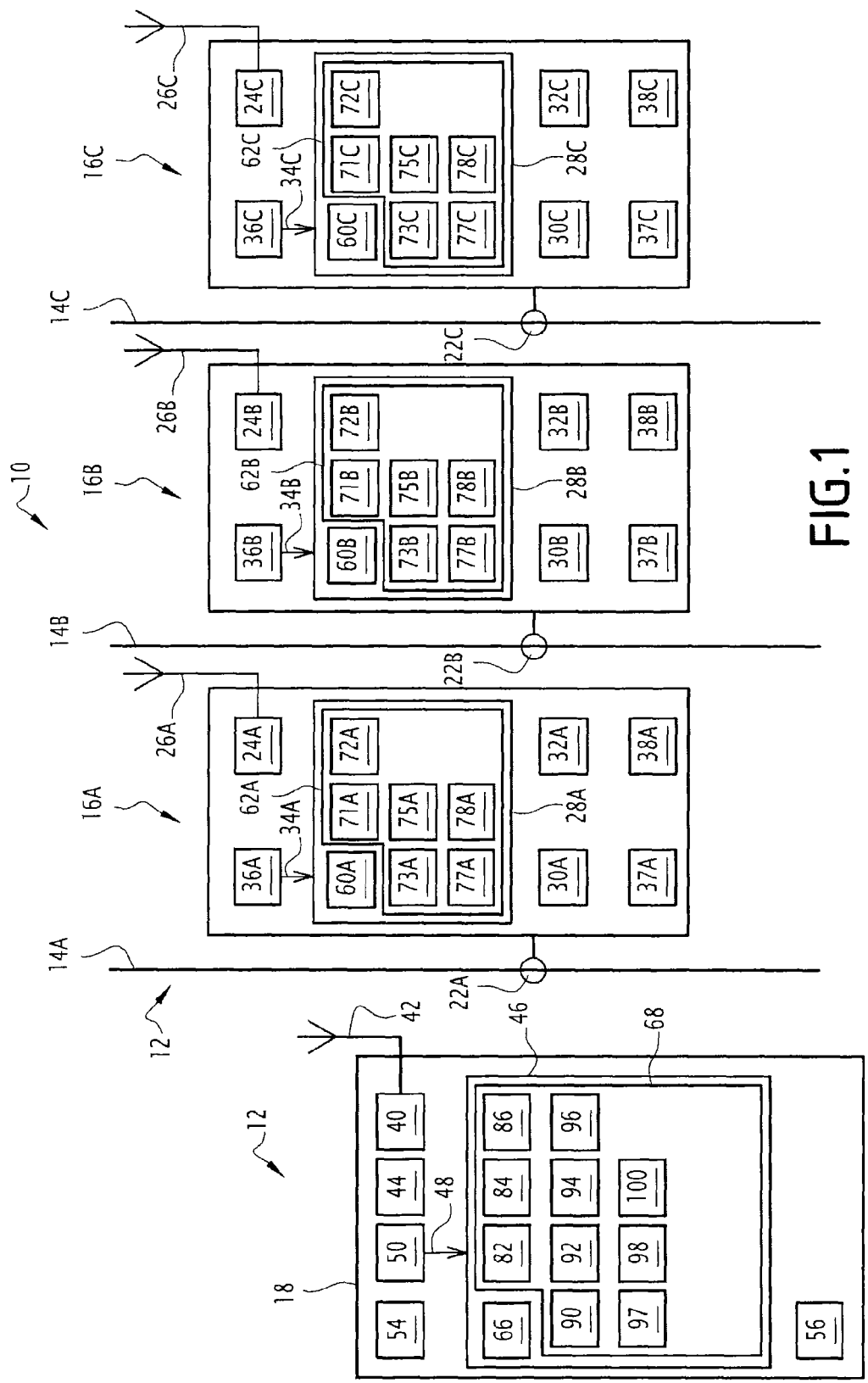
FIG. 1 is a schematic representation of a detection system according to the invention, comprising measurement modules and an acquisition unit, and installed on a three-phase electrical installation.

In FIG. 1 is represented a three-phase electrical installation 10, on which a system 12 for detecting an electrical fault is installed.

The electrical installation 10 corresponds, for example, to an overhead electricity transport network and comprises a first 14A, a second 14B and a third 14C electrical conductors. The electrical installation 10 is, for example, intended to supply an electrical load, not represented.

The detection system 12 comprises a first 16A, a second 16B and a third 16C measurement modules, associated respectively with the first 14A, second 14B and third 14C electrical conductors. More precisely, the detection system 12 comprises a measurement module 16A, 16B, 16C for each electrical conductor 14A, 14B, 14C. The detection system 12 also comprises a unit 18 for acquiring measured values of the electrical magnitude.

The electrical magnitude acquired by the detection system 12 is, for example, the intensity of a current flowing in each electrical conductor 14A, 14B, 14C.

As a variant, the electrical magnitude is a voltage measured in each conductor. In this variant, the detection member 38A is, for example, suitable for detecting an electrical fault when the value of the voltage measured on the corresponding electrical conductor is greater than a first minimum threshold of voltage U1min and/or less than a first maximum threshold U1max. The first minimum threshold of voltage U1min is, for example, equal to 50% of the nominal voltage, and the first maximum threshold of voltage U1max is, for example, equal to 150% of the nominal voltage.

In the subsequent description, only the elements of which the first measurement module 16A is composed will be described precisely, knowing that the elements of which the other measurement modules 16B, 16C are composed are identical to the elements of the first measurement module 16A and bear the same references, each time replacing the letter A by the corresponding letter B, C.

The first measurement module 16A comprises a sensor 22A for measuring the current, a first radioelectric emitter-receiver 24A, a first radioelectric antenna 26A, a first unit for processing information 28A, an analogue-digital converter 30A and a first electrical supply member 32A for powering these elements.

The first measurement module 16A comprises a first clock 34A, defined by a first initial instant I01A and a first clock frequency F1A and generated, for example, by a first clock generating unit 36A.

More generally, the first clock 34A defines a first temporal frame of reference associated with the first measurement module 16A and makes it possible to associate, with each action performed by the first module 16A, a first instant of performance at which the said action was performed. The first instant of performance is determined with respect to the first initial instant I01A and as a function of the first clock F1A, that is to say in the first temporal frame of reference, or following the first temporal frame of reference.

The first measurement module 16A also comprises a time-stamping unit 37A and a member 38A for detecting an electrical fault associated with the first conductor 14A.

The electrical fault is, for example, a fault of phase-earth type and is, for example, due to a tree branch earthing one of the electrical conductors 14A, 14B, 14C.

The acquisition unit 18 comprises a second radioelectric emitter-receiver 40, a second radioelectric antenna 42, a unit 44 for storing data and for time-stamping and a second unit for processing information 46.

The acquisition unit 18 comprises a second clock 48 defined by a second initial instant I02 and a second clock frequency F2 and generated, for example, by a second clock generating unit 50.

More generally, the second clock 48 defines a second temporal frame of reference associated with the acquisition unit 18 and makes it possible to associate, with each action performed by the acquisition unit 18, a second instant of performance at which the said action was performed. The second instant of performance is determined with respect to the second initial instant I02 and as a function of the second clock frequency F2, that is to say in the second temporal frame of reference, or following the second temporal frame of reference.

The acquisition unit 18 also comprises a communication block 54 and a second electrical supply member 56 for powering the elements that it comprises.

The current sensor 22A is suitable for measuring the value of the intensity of the current associated with the first electrical conductor 14A, that is to say travelling through the first electrical conductor 14A.

The current sensor 22A is also able, on the basis of the time-stamping unit 37A, to associate, with each value of the intensity of the current that it measures, a first instant Im1A of measurement of the said value, determined with respect to the first initial instant I01A and as a function of the first frequency F1A, that is to say according to the first temporal frame of reference.

The first radioelectric emitter-receiver 24A preferably complies with the ZIGBEE or ZIGBEE GREEN POWER communication protocol based on the IEEE-802.15.4 standard. As a variant, the first radioelectric emitter-receiver 24A complies with the IEEE-802.15.1 standard or with the IEEE-802.15.2 standard. Again as a variant, the first radioelectric emitter-receiver 24A complies with the IEEE-802-11 standard. Again as a variant, without meeting an IEEE standard, this emitter complies with the regulations in force in each country (proprietary radio communication solution).

The first radioelectric antenna 26A is adapted for emitting radioelectric signals destined for the second antenna 42 of the acquisition unit 18. Stated otherwise, each measurement module 16A, 16B, 16C is linked to the acquisition unit 18 by a corresponding radioelectric link.

The first processing unit 28A comprises a first processor 60A and a first memory 62A.

As a supplement, the analogue-digital converter 30A is suitable for sampling, according to a sampling frequency FSMP, the intensity values measured by the current sensor 22A. Thus, the analogue-digital converter 30A furthermore forms a sampling member. The analogue-digital converter 30A is suitable for associating, on the basis of the time-stamping unit 37A, a sample number and its first instant of measurement Im1A with each sample.

The first electrical power supply member 32A comprises, for example, a torus disposed around the first conductor 14A and a winding arranged around the second torus. The flow of the current in the first conductor 14A is then suitable for engendering an induced current in the winding. Stated otherwise, the first measurement module 16A is autopowered by the torus and the winding, which recover the magnetic energy and form a current transformer.

The time-stamping unit 37A is adapted for determining an instant of emission of an arbitrary message destined for the acquisition unit. The instant of emission is determined in the first temporal frame of reference.

The detection member 38A is suitable for determining the value of an instant of detection Id1A of the fault in the first temporal frame of reference associated with the measurement module 16A. The detection member 38A is, for example, suitable for detecting a fault when the variation of the intensity of the current measured by the current sensor 22A is greater than a first intensity variation threshold, for example equal to 1000 A/s during for example 20 ms.

The second radioelectric emitter-receiver 40 and the second radioelectric antenna 42 are identical to the first radioelectric emitter-receiver 24A and to the first radioelectric antenna 26A and are adapted for communicating with the first radioelectric emitter-receiver 24A and the first radioelectric antenna 26A.

The storage and time-stamping unit 44 is adapted for time-stamping and storing each datum received by the acquisition unit and for associating with each datum received at an instant of reception of the datum. Stated otherwise, the storage and time-stamping unit 44 is adapted for determining an instant of reception of an arbitrary message received by the acquisition unit. The instant of reception is determined in the second temporal frame of reference.

The second processing unit 46 comprises a second processor 66 and a second memory 68.

The communication block 54 allows a communication of the acquisition unit 18 with an exterior member, not represented, with the aid of a communication link, preferably standardized, such as a link of GSM, ModBus Serial Line Protocol, or ModBus TCP/IP Protocol type. The communication block 54 is for example adapted for communicating with a central facility, not represented, for managing the electrical installation 10 or with cutout devices, not represented, associated with the electrical conductors 14A, 14B, 14C, for interrupting the current.

The first processor 60A is adapted for executing software held in the first memory 62A.

The first memory 62A comprises a piece of software 71A for generating a cyclic message MtA, a piece of software 72A for transmitting the cyclic message destined for the acquisition unit 18, suitable for emitting the cyclic message MtA repeatedly, for example every second, and a piece of software 73A for calculating a duration of transmission DtA between the instant of detection Id1A and an instant of emission IeA of the cyclic message MtA.

The cyclic message MtA comprises a first variable V1 relating to the instant of emission IeA of the cyclic message in the first temporal frame of reference and the duration of transmission DtA. Advantageously, the cyclic message MtA comprises the value of the instant of detection Id1A in the first temporal frame of reference. In the subsequent description, the first variable is chosen equal to the instant of emission IeA.

The first memory 62A also comprises a piece of software 75A for identifying the measured samples, a piece of software 77A for generating an acquisition message MdA and a piece of software 78A for transmitting the acquisition message to the acquisition unit 18.

The acquisition message MdA comprises samples of the measured intensity of the current and at least one second variable V2 relating to the first instant of measurement of one of the samples.

The second processor 66 is adapted for executing software stored in the second memory 68.

In the subsequent description, a configuration is considered in which the first measurement module 16A detects an electrical fault to be confirmed, also said to be assumed, and the other measurement modules 16B, 16C do not detect any fault. However, the description remains valid whichever measurement module has detected the assumed electrical fault by adapting the references.

Thus, the various software presented hereinabove is suitable for being implemented subsequent to the detection of an assumed electrical fault by any of the measurement modules 16A, 16B, 16C.

The second memory 68 comprises, for each measurement module 16A, 16B, 16C furnished with a detection member 38 A and taken individually, and therefore for the first module 16A, the following elements:

a first piece of software 82 for determining the value of the instant of detection Id1B, Id1C in each first temporal frame of reference of the other first modules 16B, 16C, a second determining piece of software 84 suitable for calculating the value of the instant of detection Id2 in the second temporal frame of reference, a piece of software 86 for defining a corresponding first predefined time interval T1A, T1B, T1C for each measurement module 16A, 16B, 16C. Each corresponding first interval T1A, T1B, T1C comprises the value of the instant of detection Id1A, Id1B, Id1C determined with respect to the first initial instant I01A, I01B, I01C and as a function of the first frequency F1A, FIB, F1C of the first clock 34A, 34B, 34C of the measurement module 16A, 16B, 16C with which it is associated, a first piece of software 90 for acquiring each value measured by each measurement module 16A, 16B, 16C and whose first instant of measurement Im1A, Im1B, Im1C lies in the corresponding first interval T1A, T1B, T1C. Stated otherwise the first acquisition piece of software 90 is able to acquire the measured values solely for which the first instant of measurement lies in the corresponding first interval T1A, T1B, T1C. The first acquisition piece of software 90 is suitable for generating for each module a corresponding selection message MselA, MselB, MselC which comprises the corresponding first interval T1A T1B, T1C.

Moreover, the second memory 68 comprises a second piece of software 92 for determining, for each value acquired via the first acquisition piece of software 90, a second instant Im2A, Im2B, Im2C of measurement of the said value, determined in the second frame of reference.

The second memory 68 comprises, furthermore, a first piece of software 94 for calculating a series of third instants regularly spaced and determined with respect to the second initial instant and as a function of the second frequency, and a second calculating piece of software 96 suitable for estimating, according to a predetermined calculation scheme, the value of each value of intensity of the current measured by each sensor at the third instants, as a function of the values acquired and of the second instants of measurement Im. The calculation scheme is for example a linear, polynomial or cosine interpolation. The third instants lie around the instant of detection determined in the second temporal frame of reference, for example less 200 ms from the instant of detection.

The second memory 68 comprises, furthermore, for each measurement module 16A, 16B, 16C, a third piece of software 97 for calculating a corresponding ratio RA(2), RB(2), RB(3) between, on the one hand, a first duration D1A, D1B, D1C elapsed between two successive instants of emission IeA(1), IeA(2), IeB(1), IeB(2), IeC(1), IeC(2) and, on the other hand, a second duration D2A, D2B, D2C elapsed between two corresponding successive instants of reception IrA(1), IrA(2), IrB(1), IrB(2), IrC(1), IrC(2). The instants of reception IrA(1), IrA(2), IrB(1), IrB(2), IrC(1), IrC(2) have been determined in the second temporal frame of reference by the storage unit 44.

We thus obtain:

$$RA(2) = \frac{IeA(2) - IeA(1)}{Ira(1) - IrA(2)}$$

and the same equations for RB(2) and RC(2) on replacing the letter A by the letters B and C.

In the subsequent description, the time elapsed between each instant of emission IeA(1), IeA(2), IeB(1), IeB(2), IeC(1), IeC(2) and the corresponding instant of reception IrA(1), IrA(2), IrB(1), IrB(2), IrC(1), IrC(2) is considered to be negligible and approximately zero.

Finally, the second memory 68 comprises a confirmation piece of software 98 adapted for confirming the occurrence of the electrical fault, as a function of the acquired values of current and of the associated second instants of measurement Im2A, Im2B, Im2C.

Advantageously, the second memory 68 comprises a piece of software for managing the communication 100 adapted for periodically transmitting, for example every second, a synchronization message Msyn to all the measurement modules 16A, 16B, 16C. The synchronization message comprises, for example, for each measurement module 16A, 16B, 16C, bounds of a communication time interval PA, PB, PC, defining a temporal period during which each measurement module is suitable for transmitting the cyclic message MtA, MtB, MtC. The time interval PA, PB, PC is different for each measurement module 16A, 16B, 16C, so as to avoid collision of the cyclic messages MtA, MtB, MtC and loss of information. Each time interval is defined with respect to an instant of reception, by the corresponding measurement module 16A, 16B, 16C of the synchronization message Msyn and as a function of the first frequency F1A, F1B, F1C of the measurement module 16A, 16B, 16C.

The piece of software for calculating the duration of transmission 73A is suitable for associating, with each instant of detection Id1A, a following instant of emission IeA(2) of the cyclic message MtA(2), subsequent to the instant of detection Id1A. The calculating piece of software 73A is adapted for fixing the duration of transmission DtA equal to the difference between the following instant of emission IeA(2) and the instant of detection Id1A.

The identifying piece of software 75A is, for example, suitable for identifying the samples whose first instant of measurement belongs to the first interval T1A, T1B, T1C transmitted via the corresponding selection message MselA, MselB, MselC. Each generating piece of software 77A, 77B, 77C is then adapted for generating a corresponding acquisition message MdA(1), MdA(2), MdA(3) comprising the samples identified and the second variable V2.

Advantageously, the identifying piece of software 75A is for example suitable for identifying a first sample corresponding to the identified sample associated with the smallest first instant of measurement Im1A, Im1B, Im1C and a last sample corresponding to the identified sample associated with the largest first instant of measurement Im1A, Im1B, Im1C. The corresponding acquisition message then comprises the first instants of measurement of the first sample and of the last sample.

The first determining piece of software 82 is suitable for calculating the value of the instant of detection Id1A for each of the first temporal frames of reference. More precisely, the first calculating piece of software 82 is suitable for calculating for each measurement module 16A, 16B, 16C a third duration D3A, D3B, D3C between, on the one hand, the instant of reception IrA(2), IrB(2), IrC(2), in the second temporal frame of reference, of a last cyclic message MtA(2), MtB(2), MtC(2) transmitted by the measurement module and, on the other hand, the instant of detection Id2 calculated in the second temporal frame of reference.

The first calculating piece of software 82 is then suitable for determining, in the first temporal frame of reference of each measurement module 16A, 16B, 16C, the value of the instant of detection Id1A, Id1B, Id1C as a function of the instant of emission of the last cyclic message emitted IeA(2), IeB(2), IeC(2) by the corresponding measurement module, of the corresponding ratio RA(2), RB(2), RC(2) and of the corresponding third duration D3A, D3B, D3C. We thus obtain, for example, IdB=IeB(2)−(D3B*RB(2)) and IdC=IeC(2)−(D3C*RC(2)).

The second determining piece of software 84 is suitable for calculating the value of the instant of detection Id2 in the second temporal frame of reference as a function of the duration of transmission DtA, of the value of the corresponding instant of reception IrA(2) and of the corresponding ratio Ra(2). We thus obtain, for example, $$Id = IrA(2) - \frac{DtA}{Ra(2)}.$$

The defining piece of software 86 is suitable for determining, for each first module 16A, 16B, 16C, the corresponding first interval T1A, T1B, T1C as a function of the corresponding ratio RA(2), RB(2), RC(2), of a corresponding third duration D3A, D3B, D3C and of the time of emission of the corresponding last cyclic message IeA(2), IeB(2), IeC(2) in the first temporal frame of reference. Each first interval is predefined, for example according to the following equations:

$T1A=[IeA(2)-((D3A+Cst2)*RA(2));IeA(2)-((D3A-Cst1)*Ra(2))]$, $T1B=[IeB(2)-((D3B+Cst2)*RB(2));IeB(2)-((D3B-Cst1)*RB(2))]$, $T1C=[IeC(2)-((D3C+Cst2)*RC(2);IeA(2)-((D3C-Cst1)*RC(2))]$, with Cst1 and Cst2 being constant values.

The second determining piece of software 92 is suitable for calculating the second instant of measurement Im2A, Im2B, Im2C of each value acquired as a function of the transmitted corresponding second variable V2. Advantageously, the second calculating piece of software 92 is suitable for calculating the second instant of measurement Im2A, Im2B, Im2C of each acquired value, as a function of the first instants of measurement Im1A, Im1B, Im1C, of the first sample and of the last sample transmitted.

More precisely, the second determining piece of software 92 is, for example, suitable for receiving the instant of emission of the acquisition message and for determining the instant of reception of the acquisition message, and then for calculating as a function of the instant of emission, of the first instant of measurement of the first sample, of the instant of reception and of the corresponding ratio of the value of the second instant of measurement of the first sample. The second determining piece of software 92 is then suitable for also determining the value of the second instant of measurement of the last sample in a similar manner and for determining the second instant of measurement of each sample as a function of the number of samples acquired, of the corresponding ratio and of the second instants of measurement of the first and of the last sample.

For example, the second determining piece of software 92 defines a sampling comb on a part common to all the signals received on the part of the sensors. A series of dates is associated with the sampling comb in the second temporal frame of reference, and this series of dates is converted in the first temporal frame of reference of each measurement module 16A, 16B, 16C.

For a given signal, each of these converted dates is bracketed by two sampling dates in the first temporal frame of reference.

The three dates and the two values of samples make it possible to apply a linear interpolation.

Other principles of interpolation are of course possible, by taking as needed further points in front of and behind the point of each of the converted dates.

The first calculating piece of software 94 is, for example, suitable for calculating the third instants as a function of the value of the instant of detection in the second temporal frame of reference. The third instants lie in a reference interval Tref, a minimum bound of which is for example equal to the instant of detection Id2 in the second frame of reference, from which has been subtracted a value equal to the constant Cst2, and a maximum bound of which is for example equal to the instant of detection Id2 in the second frame of reference, to which has been added a value equal to the constant Cst1.

The confirmation piece of software 98 is for example suitable for summing the intensity values estimated for one and the same third instant. More precisely, when the sum is greater than a second threshold of current A2 the occurrence of the electrical fault is confirmed. The second threshold of current A2 is, for example, equal to 30 A.

Advantageously again, the acquisition unit 18 is suitable for transmitting, to each measurement module 16A, 16B, 16C, an indication message MindicA, MindicB, MindicC, indicating that the acquisition message MdA(1), MdA(2), MdA(3) transmitted by the measurement module 16A, 16B, 16C has indeed been received.

Figure 3:
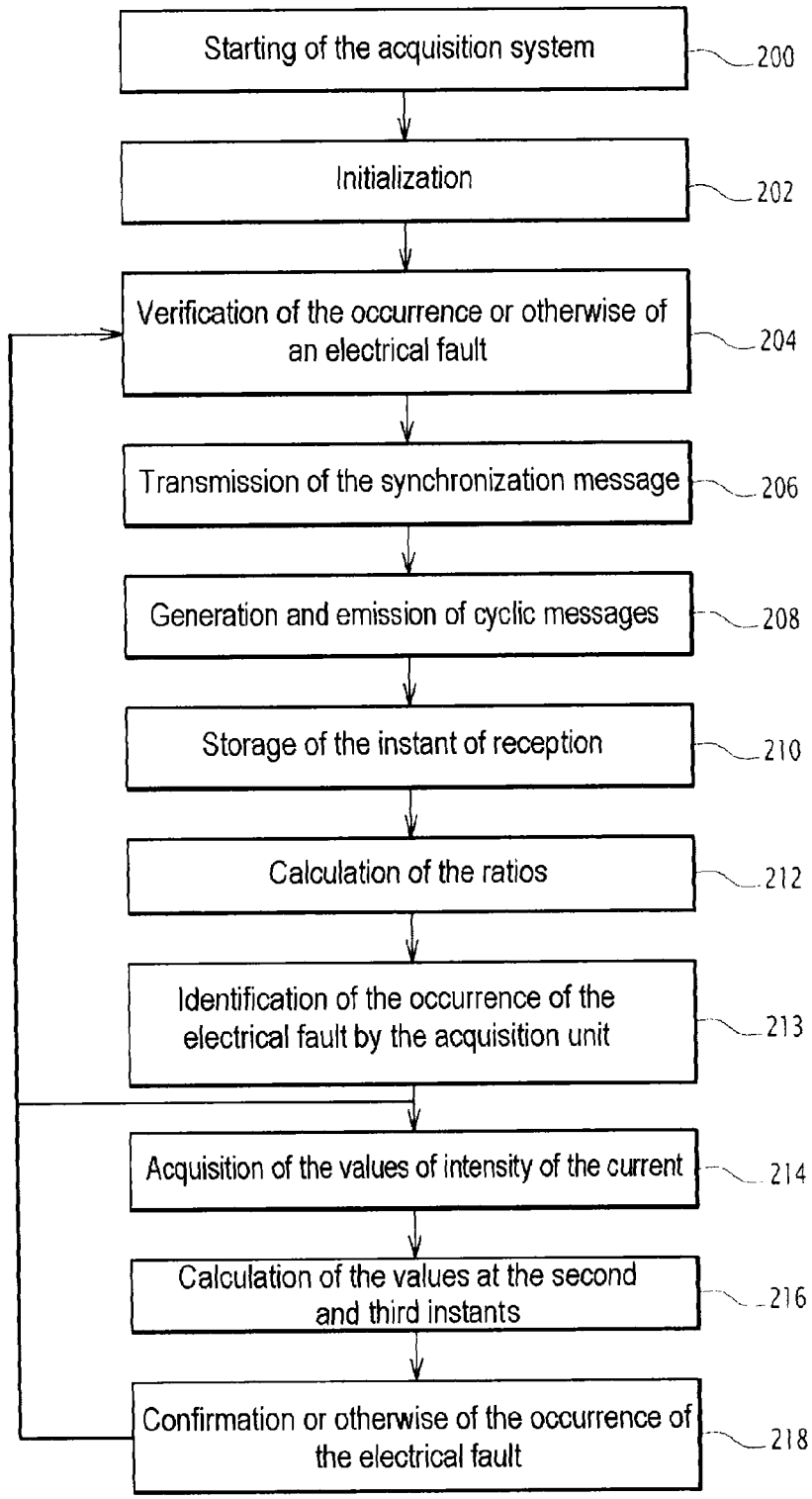
FIG. 3 is a flowchart of the steps of a detection method according to the invention.

An example of a method for detecting an electrical fault in accordance with the invention is presented in FIG. 3. Such a method is implemented by the detection system 12 described hereinabove.

The detection method is presented within the framework of the detection of an electrical fault assumed at the level of the first measurement module 16A.

In the course of a first step 200 of starting the detection system 12, each measurement module 16A, 16B, 16C is powered up, as is the acquisition unit 18 too. The measurement modules 16A, 16B, 16C start respectively at the first initial instants I01A, I01B, I01C and the acquisition unit 18 starts at the second initial instant I02.

Next, during a following step 202 of initialization, the acquisition unit 18 transmits the synchronization message Msyn to each measurement module 16A, 16B, 16C. Each measurement module 16A, 16B, 16C therefore receives the values of the bounds of the communication interval PA, PB, PC. Thereafter, each measurement module 16A, 16B, 16C transmits the cyclic message MtA(1), MtB(1), MtC(1), that it has generated via its generating piece of software 71A, 71B, 71C. Each cyclic message MtA(1), MtB(1), MtC(1) is emitted as a function of the communication interval PA, PB, PC bounds received by the measurement module 16A, 16B, 16C and of the first temporal frame of reference associated with the measurement module 16A, 16B, 16C which emits it. Stated otherwise, in the case of the first measurement module 16A, the first measurement module 16A counts for example a number of periods of the first clock 34A that have occurred since the reception of the synchronization message Msyn and when the number which has occurred corresponds to a time equal to a lower bound of the communication interval PA, it emits the cyclic message MtA. The duration of transmission included in the cyclic messages MtA(1), MtB(1), MtC(1) has a value indicating that no fault has been detected. Advantageously, the cyclic message MtA(1), MtB(1), MtC(1) comprises a third variable V3A, V3B, V3C having a value indicating the non-detection of the electrical fault.

Thereafter, still in the course of the initialization step 202, the acquisition unit 18 stores the value of the instant of reception IrA(1), IrB(1), IrC(1) of each cyclic message MtA(1), MtB(1), MtC(1) emitted by each measurement module 16A, 16B, 16C.

Figure 2:
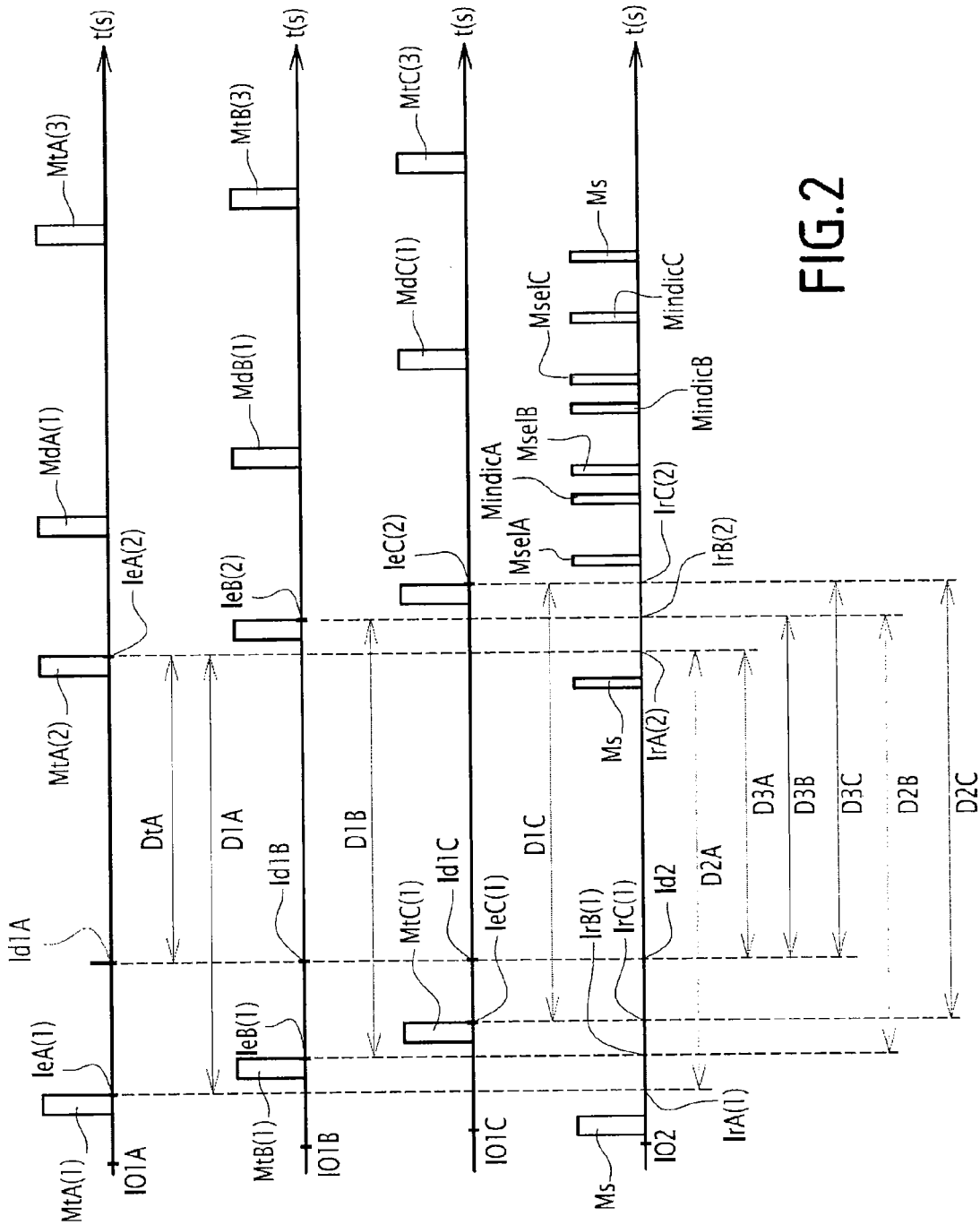
FIG. 2 is a timechart representing the scheduling of messages exchanged between the acquisition unit and the measurement modules of FIG. 1.

Next, in the course of a verification step 204, each measurement module 16A, 16B, 16C conforms or otherwise to the occurrence of the electrical fault assumed at the level of the electrical conductor 14A, 14B, 14C with which it is associated. With reference to FIG. 2, and in the example considered, the detection member 38A detects the electrical fault assumed in the course of the verification step 204 and determines the value of the instant of detection in the first frame of reference.

Thereafter, in the course of a synchronization step 206, the acquisition unit 18 transmits the synchronization message Msyn to each measurement module 16A, 16B, 16C.

During a generation step 208, each measurement module 16A, 16B, 16C generates the corresponding cyclic message MtA(2), MtB(2), MtC(2). The third variable V3A included in the cyclic message MtA(2) has a value indicating the occurrence of the assumed electrical fault, while in the cyclic messages MtB(2), MtC(2), the third variable V3B, V3C has a value relating to the non-detection of the assumed electrical fault. Next, each measurement module 16A, 16B, 16C emits the cyclic message MtA(2), MtB(2), MtC(2) that it has generated directed towards the acquisition unit 18.

Thereafter, during a verification step 210, the acquisition unit 18 stores the value of the instant of reception of each cyclic message MtA(2), MtB(2), MtC(2).

During a calculation step 212, the acquisition unit 18 calculates the first durations D1A, D1B, D1C and second durations D2A, D2B, D2C, on the basis of which it calculates the ratios RA(2), RB(2), RC(2) associated with each measurement module 16A, 16B, 16C.

Next, in the course of an identification step 213, the acquisition unit 18 identifies whether or not one of the measurement modules has detected the electrical fault. In this example, the acquisition unit identifies for example, via the third variables, the occurrence of the assumed electrical fault on the first conductor 14A and the non-detection of the electrical fault on the other conductors 14B, 14C.

If the occurrence of no fault has been identified by the measurement modules, in the course of the identification step 213, then the method returns to the verification step 204.

Otherwise, for each measurement module 16A, 16B, 16C that has detected the electrical fault, the method comprises the steps presented hereinbelow.

In the course of a step 214 of acquiring the intensity values of the current, the acquisition unit 18 calculates the value of the instant of detection Id2, Id1A, Id1B, Id1C in the second frame of reference and in each first frame of reference, the third durations D3A, D3B, D3C and determines the first predefined time interval T1A, T1B, T1C for each first module 16A, 16B, 16C. Thereafter, the acquisition unit generates the selection messages MselA, MselB, MselC, and each selection message MselA, MselB, MselC is successively transmitted. More precisely, subsequent to the transmission of a selection message MselA, MselB, MselC, the reception of the corresponding acquisition message MdA(1), MdB(1), MdC(1) is awaited before transmitting another selection message. Subsequent to the reception of the selection message intended for it, each measurement module 16A, 16B, 16C generates the corresponding acquisition message MdA(1), MdA(2), MdA(3) and transmits it to the acquisition unit 18. Advantageously, subsequent to the reception of the acquisition message, the acquisition unit 18 transmits the indication message MindicA, MindicB, MindicC to the corresponding measurement module, indicating to the measurement module 16A, 16B, 16C that the acquisition message transmitted by the measurement module 16A, 16B, 16C has indeed been received.

Next, subsequent to the reception of all the acquisition messages, during a calculation step 216, the acquisition unit 18 calculates the second instants of measurement Im2A, Im2B, Im2C of the values or samples acquired, and then determines the series of third instants and the value of the intensity of the current measured by each sensor at the third instants.

Finally, during a confirmation step 218, the acquisition unit sums the intensity values of the current determined for each same third instant, and confirms or otherwise the detection of the occurrence of the electrical fault. More precisely, if the sum of the measured intensity values of the current is greater than the second threshold of current A2 then the fault is confirmed and, in the converse case, the detection of the fault is denied.

Subsequent to step 218, the verification step 204 is, for example, repeated with a periodicity of 1 second.

Advantageously, if the same method is used to also recover the voltage values measured on each electrical conductor 14A, 14B, 14C, the confirmation piece of software is able to identify, as a function of the phase shift of the voltages and currents estimated for one and the same third instant, the upstream or downstream location of the electrical fault with respect to the measurement modules and in relation to the source. In this variant, the measurement modules measure the current and the voltage, and the occurrence of the electrical fault is confirmed as a function of the values of current and/or voltage. The confirmation piece of software is, for example, suitable for summing the voltage values estimated for one and the same third instant. More precisely, when the sum of the estimated voltages is greater than a second threshold of voltage U2 and/or when the sum of the estimated intensities of the current is greater than the second threshold of current A2, the occurrence of the electrical fault is confirmed. The second threshold of voltage U2 is, for example, equal to 10 kV.

Advantageously, the acquisition unit comprises a lamp adapted for lighting up in various colours according to the confirmation or otherwise of the occurrence of the electrical fault.

The detection system 12 makes it possible to obtain the value of the instant of detection Id1A in each first frame of reference and in the second frame of reference, and thus to precisely identify the values measured by each measurement module at the moment of the instant of detection. This makes it possible to take into account the differences in values between each first initial instant and the second initial instant, and between each first clock frequency and the second clock frequency.

The detection system thus makes it possible to acquire, for each measurement module, the values measured around one and the same absolute instant corresponding to the detection of the assumed electrical fault. The values acquired by the acquisition unit for each measurement module have therefore been measured globally at the same instant and at the moment of the occurrence of the assumed electrical fault, thereby making it possible to facilitate and to improve the confirmation of the detection of the electrical fault on the basis of these values.

Furthermore, the detection system 12 makes it possible to decrease the amount of information exchanged between the measurement modules and the acquisition unit since the acquisition unit 18 recovers only the measured values having a first instant of measurement lying in the first intervals.

Moreover, the detection system 12 makes it possible to obtain the values measured by each measurement module 16A, 16B, 16C, around the instant of detection, in one and the same temporal frame of reference which is the second temporal frame of reference. This makes it possible to precisely verify the temporal disparities between the instants of measurement of the various measured values and in particular to estimate, that is to say to extrapolate, the value of the current flowing on each conductor at one and the same instant by virtue of the first calculating piece of software 94.

Finally, the system makes it possible to obtain synchronized, that is to say obtained at the same instant, values of the current and/or of the voltage on each electrical conductor 14A, 14B, 14C, at the moment of the occurrence of an assumed electrical fault, and thus to confirm or otherwise the occurrence of the electrical fault.

As a variant, certain measurement modules 16A, 16B, 16C do not comprise any detection member.

According to another variant, the acquisition unit 18 is integrated into one of the measurement modules 16A, 16B, 16C and the second clock is identical to the first clock of the measurement module into which the acquisition unit is integrated. The manner of operation is then substantially identical to what was presented hereinabove apart from the fact that the acquisition unit does not communicate by radio but by wire with the measurement module into which it is integrated. In this variant, the values measured by each measurement module 16A, 16B, 16C, around the instant of detection, are obtained in one and the same temporal frame of reference, which is the first temporal frame of reference associated with the measurement module comprising the acquisition unit.

According to another variant, the first memory 62A comprises a piece of software for identifying the sample numbers of the samples whose first instant of measurement belongs to the first interval transmitted via the corresponding selection message MselA, MselB, MselC, and an emission piece of software adapted for emitting destined for the acquisition unit 18 an identification message comprising the sample numbers of identified samples. The acquisition unit is then suitable for transmitting to each measurement module 16A, 16B, 16C a message requesting the sample numbers that it has received from the corresponding module and each measurement module 16A, 16B, 16C dispatches in response the corresponding acquisition message MdA, MdB, MdC destined for the acquisition unit 18. In this variant, the acquisition message MdA, MdB, MdC comprises all the samples requested via the requesting message.

The invention claimed is:

1. A system for detecting an electrical fault in an electrical installation comprising several electrical conductors, the system comprising:
   at least two measurement modules, each measurement module comprising first radioelectric communication device, a sensor for measuring each electrical magnitude associated with a corresponding electrical conductor and a first clock defined by a first initial instant and a first clock frequency, each measured value being suitable for being associated with a first instant of measurement, determined with respect to the first initial instant and as a function of the first frequency,
   an acquisition unit for acquiring the measured values, comprising second radioelectric device adapted for communicating with the first radioelectric communication device,
   said system further comprising, for at least one of the measurement modules, a member for detecting the electrical fault associated with the corresponding electrical conductor, the detection member being suitable for determining the value of an instant of detection of the fault with respect to the first initial instant and as a function of the first frequency,
   wherein the acquisition unit comprises:
   a first determination device for determining the value of each instant of detection with respect to the first initial instant and as a function of the first frequency of the other measurement modules,
   a device of acquisition for each measurement module of solely the measured values for which the first instant of measurement lies in a corresponding first predefined time interval, each corresponding first interval comprising the value of the instant of detection determined for the said measurement module with which it is associated.

2. The system according to claim 1, in which the acquisition unit comprises a second clock defined by a second initial instant and a second clock frequency, and in which the first determination device is suitable for determining the value of the instant of detection, with respect to the second initial instant and as a function of the second frequency.

3. The system according to any one of claim 2, in which each measurement module comprises a generation device of generation of a cyclic message, comprising a first variable dependent on an instant of emission of the cyclic message with respect to the first initial instant and according to the first frequency, and a transmission device of transmission of the cyclic message destined for the acquisition unit, in which the acquisition unit is suitable for determining an instant of reception of the cyclic message, with respect to the second initial instant and as a function of the second frequency, and in which for each measurement module, the acquisition unit comprises a third device for calculating a ratio between, on the one hand, a first duration between two successive instants of emission and, on the other hand, a second duration between two corresponding instants of reception.

4. The system according to claim 3, in which each measurement module furnished with a detection member comprises a fourth calculation device for calculating a duration of transmission, the fourth calculation device being suitable for associating with each instant of detection a following instant of emission, after the instant of detection, and for calculating the duration of transmission between the instant of detection and the following instant of emission, the cyclic message comprising the duration of transmission.

5. The system according to claim 4, in which the first determination device is suitable for calculating, with respect to the second initial instant and as a function of the second frequency, the value of the instant of detection as a function of the duration of transmission, of the value of the instant of reception and of the ratio.

6. The system according to claim 3, in which the first determination device is suitable for calculating, for each measurement module, a third duration between the instant of reception of a last cyclic message transmitted by the measurement module and the instant of detection calculated with respect to the second initial instant and as a function of the second frequency, and for determining, with respect to the first initial instant and to the first frequency of each measurement module, the value of the instant of detection as a function of the instant of emission of the last cyclic message, of the corresponding ratio and of the corresponding third duration.

7. The system according to claim 6, in which the acquisition unit comprises, for each measurement module, a definition device for defining the corresponding first predefined interval as a function of the corresponding ratio, of a corresponding third duration and of the emission time of a last cyclic message with respect to the first initial instant and as a function of the first frequency.

8. The system according to claim 1, in which the acquisition unit comprises a second clock defined by a second initial instant and a second clock frequency, and in which the acquisition unit comprises a second determination device of determination, for each acquired value, of a second instant of measurement of the said value, determined with respect to the second initial instant and as a function of the second frequency.

9. The system according to claim 8, in which the acquisition unit comprises a first calculation device suitable for calculating a series of third instants regularly spaced and determined with respect to the second initial instant and as a function of the second frequency, and a second calculation device suitable for estimating the value of each electrical magnitude measured, at the third instants and as a function of the values acquired and of the second instants of measurement.

10. The system according to claim 8, in which the acquisition unit comprises a confirmation device adapted for confirming the occurrence of the electrical fault as a function of the values acquired and of the associated second instants of measurement.

11. The system according to claim 1, in which the electrical magnitude or magnitudes are chosen from among a voltage and a current.

12. The system according to claim 1, in which each measurement module comprises a sampling member suitable for sampling the measured values of each electrical magnitude according to a sampling frequency, a sample number and the corresponding first instant of measurement being associated with each sample,
- in which the device of acquisition is suitable for transmitting to each measurement module, via a selection message, the corresponding first interval, and
- in which each measurement module is suitable for transmitting to the acquisition unit, via an acquisition message, the samples whose first instant lies in the corresponding first interval received and at least one second variable relating to the first instant of measurement of one of the samples.

13. A method for detecting an electrical fault in an electrical installation comprising several electrical conductors, the method being implemented with the aid of a system for detecting the electrical fault comprising:
- at least two measurement modules, each measurement module comprising a first radioelectric communication device, a sensor for measuring each electrical magnitude associated with a corresponding electrical conductor and a first clock defined by a first initial instant and a first clock frequency, each measured value being suitable for being associated with a first instant of measurement determined with respect to the first initial instant and as a function of the first frequency,
- an acquisition unit for acquiring the measured values, comprising a second radioelectric communication device adapted for communicating with the first radioelectric device, said method comprising, for at least one of the measurement modules, the following steps
- a) detecting the electrical fault on the corresponding electrical conductor,
- b) determining the value of an instant of detection of the fault with respect to the first initial instant and as a function of the first frequency, and wherein the method comprises the following steps:
- c) determining by the acquisition unit of the value of each instant of detection with respect to the first initial instant and as a function of the first frequency of the other measurement modules,
- d) acquiring, by the acquisition unit and for each measurement module, solely the measured values for which the first instant of measurement lies in a corresponding first predefined time interval, each corresponding first interval comprising the value of the instant of detection determined for the said measurement module.

14. The method according to claim 13, in which the acquisition unit comprises a second clock defined by a second initial instant and a second clock frequency, and in which, during the step of acquiring, the method comprises the following step:
- e) calculating, for each acquired value, a second instant of measurement of the value, determined with respect to the second initial instant and as a function of the second frequency.

15. The method according to claim 13, in which, prior to the step of determining, the method comprises a step of identifying, in the course of which the acquisition unit verifies whether or not one of the measurement modules has detected the electrical fault, and in which the step of determining and the step of acquiring are performed only if the occurrence of the electrical fault is identified during the identification step.

* * * * *

UNITED STATES PATENT AND TRADEMARK OFFICE
CERTIFICATE OF CORRECTION

PATENT NO. : 9,671,449 B2
APPLICATION NO. : 14/797360
DATED : June 6, 2017
INVENTOR(S) : Olivier Coutelou et al.

Page 1 of 1

It is certified that error appears in the above-identified patent and that said Letters Patent is hereby corrected as shown below:

In the Specification

Column 8, Line 57, change "Mse1A, Mse1B, Mse1C" to --MseIA, MseIB, MseIC--;

Column 10, Lines 4-5, change "Mse1A, Mse1B, Mse1C" to --MseIA, MseIB, MseIC--;

Column 13, Line 24, change "Mse1A, Mse1B, Mse1C" to --MseIA, MseIB, MseIC--;

Column 13, Line 25, change "Mse1A, Mse1B, Mse1C" to --MseIA, MseIB, MseIC--;

Column 13, Line 27, change "Mse1A, Mse1B, Mse1C" to --MseIA, MseIB, MseIC--;

Column 15, Line 8, change "Mse1A, Mse1B, Mse1C" to --MseIA, MseIB, MseIC--; and

In the Claims

Column 15, Line 62, delete "any one of.".

Signed and Sealed this
Sixteenth Day of April, 2019

Andrei Iancu
*Director of the United States Patent and Trademark Office*